TRAVELING SOLVENT METHOD OF GROWING SILICON CARBIDE CRYSTALS
AND JUNCTIONS UTILIZING YTTRIUM AS THE SOLVENT
Filed Sept. 22, 1970

Inventor:
Ronald J. Perusek
by Norman C. Fulmer
His Attorney 3,669,763

TRAVELING SOLVENT METHOD OF GROWING SILICON CARBIDE CRYSTALS AND JUNCTIONS UTILIZING YTTRIUM AS THE SOLVENT

Ronald J. Perusek, Chardon, Ohio, assignor to General Electric Company

Filed Sept. 22, 1970, Ser. No. 74,265
Int. Cl. H01l *7/42;* B01j *17/02, 17/20*
U.S. Cl. 148—171 7 Claims

ABSTRACT OF THE DISCLOSURE

A "sandwich" is formed, comprising a layer of yttrium metal positioned between and in contact with two wafers of silicon carbide. The sandwich is heated, preferably in a specific sequence of temperature and time, so that one of the wafers is hotter than the other and the yttrium melts, whereby silicon carbide at the hotter interface dissolves in the yttrium, and this solvent zone travels through the hotter wafer and causes growth of a silicon carbide crystal on the cooler wafer. By using p-type and n-type wafers together and by introducing certain impurities into the yttrium, an abrupt p-n junction can be formed.

BACKGROUND OF THE INVENTION

The invention is in the field of growing silicon carbide crystals and junctions.

One way of carrying out the "traveling solvent" method of growing silicon carbide crystals, or junctions, consists of placing a "solvent" material, such as chromium or silicon, between two wafers of silicon carbide, in sandwich-like manner, and heating this sandwich so that one wafer is hotter than the other and the solvent melts. The silicon carbide at the hotter interface dissolves in the molten solvent, and this solvent zone travels through the hotter wafer and causes growth (or regrowth) of a silicon carbide crystal on the cooler wafer. By using p-type and n-type wafers together, the regrowing process forms a p-n junction which can be used in solid-state lamps and other semiconductor devices. The process requires accurate control of time, temperature, and cleanliness to achieve satisfactory results, and the method requires a considerable length of time to perform.

SUMMARY OF THE INVENTION

Objects of the invention are to provide an improved method of growing silicon carbide crystals and junctions, and to provide a new solvent material for use in the traveling solvent method of growing silicon carbide crystals and junctions, which achieves improved yield of useful crystals and junctions, which shortens the manufacturing time, and reduces the cost of manufacturing.

The method of the invention comprises, briefly and in a preferred embodiment, the steps of forming a sandwich of silicon carbide wafers with a very thin (about 4 to 8 micron) layer of yttrium metal therebetween, and heating the wafers unequally at a temperature such that the yttrium melts thereby dissolving silicon carbide at the hotter interface and causing epitaxial growth of a silicon carbide crystal at the cooler interface.

DESCRIPTION OF THE PREFERRED EMBODIMENT

Figure 1:
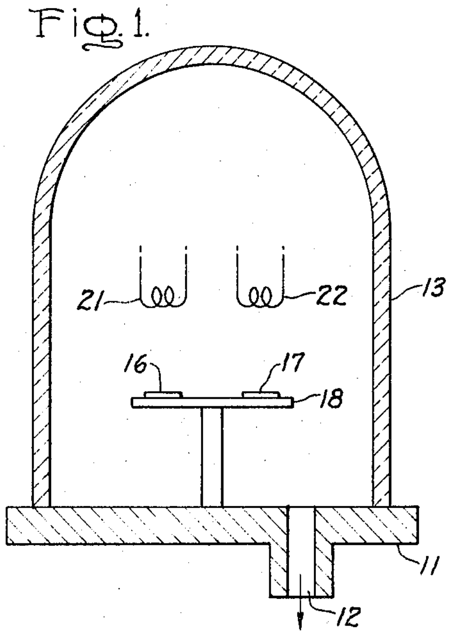
FIG. 1 is a cross-sectional view of a vacuum evaporation chamber, in which yttrium and junction-forming impurities are deposited onto wafers of silicon carbide.

The vacuum evaporation apparatus of FIG. 1 consists of a base plate 11 provided with a vacuum port 12, and a cover 13, preferably of glass, which fits onto the base 11 in a vacuum-tight manner. A pair of silicon carbide wafers 16 and 17 are positioned on a platform 18 carried by the base plate 11 within the cover 13. A first heater coil 21 is coated with yttrium metal, or has a chip of yttrium contained in or attached thereto, and, with a vacuum in the evaporation apparatus, the heater coil 21 is heated so as to evaporate the yttrium whereupon it becomes deposited on the upper surfaces of both of the silicon carbide wafers 16 and 17. Preferably, the platform 18 is heated to a temperature of about 500–600° C. during the evaporation of yttrium onto the wafers 16 and 17. Simultaneously, or subsequently, a second heater coil 22 may be electrically heated, and it has a doping or impurity material coated thereon, or contained therein, such as aluminum or boron, whereupon the impurity is evaporated onto both wafers 16 and 17, along with the yttrium metal. By this process, a relatively thin layer of yttrium, for example, approximately 2 to 4 microns thickness, suitably covered or doped with a controlled impurity if desired, is deposited on each of the silicon carbide wafers 16 and 17.

Figure 2:
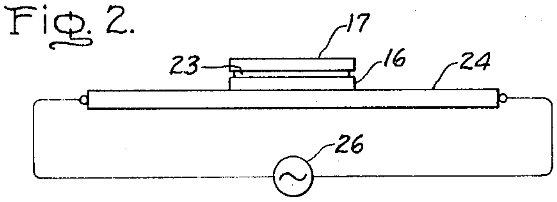
FIG. 2 is a side view showing a sandwich of silicon carbide wafers, with a layer of yttrium metal therebetween, being heated on an electrically heated carbon heater strip.

The silicon carbide wafers 16 and 17 are then placed together, with the yttrium coatings thereon in mutual adjacency to form a "sandwich" as shown in FIG. 2, in which the yttrium metal is designated by numeral 23. If a p-n junction is desired, the upper crystal is n-type and the lower one is p-type; and a p-type dopant is evaporated with the yttrium as described above. The aforesaid sandwich is placed on a carbon strip heater 24, which is electrically heated by means of an electrical power source 26, in an atmosphere of inert gas.

A preferred sequence of steps in the process by the apparatus shown in FIG. 2, is as follows. The sandwich comprising the silicon carbide wafers 16 and 17, with the yttrium metal 23 therebetween, and also the doping impurities therebetween, if present, is heated by means of the carbon strip heater 24, slowly to a temperature of 800° C. for one minute, in an atmosphere of argon and hydrogen (3:1 ratio of argon to hydrogen), in order to clean the materials. The atmosphere is then changed to pure argon or pure helium, at approximately a pressure of one to two atmospheres, and the temperature is slowly raised to the melting temperature of yttrium (1490° C.) for one minute. During this first melt, the wetting of the molten yttrium to the silicon carbide wafers 16 and 17 reaches approximately 90% of completeness. The temperature is then slowly raised by approximately 50° C., to obtain 100% wetting of the yttrium onto the silicon carbide wafers. For abrupt p-n junctions with heavily doped p-layers, the temperature should be maintained constant for at least one-half hour; one hour produces about .005 inch of growth. For maximum growth rates of n-type epitaxial layers, the temperature may be taken up to 2000° C. or higher at this point. During this second melt, the yttrium dissolves silicon carbide at its interface with the lower (hotter) wafer and this solvent zone travels, in effect, downwardly through the lower and hotter wafer 16, and at the same time pure silicon carbide crystal forms at the lower surface of the top (cooler) wafer 17. Expressed another way, silicon carbide is removed from the lower (hotter) wafer 16 and flows upwardly and is deposited on the lower surface of the upper (cooler) wafer 17. The temperature difference between the two wafers is about 50 to 100° C., depending on the thickness of the upper wafer. The traveling solvent process may be contained all the way through the lower "feed" wafer 16, or may be terminated prior to this in which case the solvent zone 23 is removed by means of dilute acid or aqua regia, and the upper "seed" wafer 17 containing the regrown silicon carbide thereon is ready for further processing (if required) and ultimate use.

An important and advantageous difference from the previous traveling solvent methods, is that the evaporated layer of yttrium in accordance with the invention can be as thin as only 4 microns, whereas, for example, U.S. Pat. 3,205,101 specifies (in column 7, line 73) that a sheet of chromium is to be used which has a thickness of 1 to 5 mils (25 to 125 microns). The thinner solvent zone achieved by the invention results in a desirably more abrupt p-n junction, due to reduced intermixing of the p-dopant and n-dopant.

One use for a silicon carbide wafer prepared as described above and having a p-n junction, is in a solid-state lamp, in which the wafer may be attached, p-side down, to a metal header providing one electrical connection thereto, and the other electrical connection is made by means of a "dot" contact on the p-side thereof, as described in further detail in U.S. Pat. No. 3,458,779 to Drs. Blank and Potter.

The above-described method, using yttrium as the solvent, achieves several advantages over prior techniques such as the use of chromium as a solvent, including a shorter processing time (the rate of "travel," using yttrium, is up to 0.001 inch per second (at 2000° C.), whereas when using chromium the rate is about 0.001 inch per minute), less diffusion of impurities through the junction region, more uniform crystal growth (or regrowth) rate, thinner solvent zone (more abrupt junction), and higher yield of useful product (100% yield has been readily achieved). Also, the wafers used for the process of the invention need not be finely polished as in the prior art methods, but may be polished, or fine ground, or natural grown crystals that have been acid cleaned and washed in de-ionized water and dried; however, best results usually are obtained if the seed (cooler) wafer is highly polished and the feed (hotter) wafer is fine ground. Instead of evaporating yttrium onto the wafers as described above, a small sheet or chunk of yttrium may be placed between the wafers to form the "sandwich," along with a chip of the desired impurity dopant, or a piece of yttrium-aluminum eutectic can be used. The wafers may, if desired, be both p-type, both n-type, or one p-type and one n-type.

While a preferred embodiment of the invention, and modifications thereof, have been described, other embodiments and modifications thereof will become apparent to persions skilled in the art, and will fall within the scope of invention as defined in the following claims.

What I claim as new and desire to secure by Letters Patent of the United States is:

1. A traveling solvent method of growing silicon carbide crystals, comprising the steps of forming a sandwich of silicon carbide wafers with yttrium therebetween and in contact therewith, and heating said sandwich in a manner so that one of said wafers is hotter than the other and at a temperature such that said yttrium melts, thereby forming a traveling solvent zone which causes growth of silicon carbide crystal on the relatively cooler of said wafers.

2. A method as claimed in claim 1, in which one of said wafers is p-type silicon carbide and the other of said wafers is n-type silicon carbide.

3. A method as claimed in claim 2, including the step of adding one or more dopant impurities to said solvent zone.

4. A method as claimed in claim 1, including the step of evaporating a layer of yttrium onto a surface of each of said silicon carbide wafers prior to said step of forming a sandwich.

5. A method as claimed in claim 4, including the further step of evaporating dopant impurities onto said surfaces of the wafers, along with said yttrium layers.

6. A method as claimed in claim 4, in which said wafers are heated to about 500 to 600° C. during said evaporating step.

7. A method as claimed in claim 1, in which said heating of the sandwich comprises the steps of heating the sandwich to about 800° C. in an atmosphere of inert gas and hydrogen to clean the materials, followed by increasing the temperature to the melting point of yttrium (about 1490° C.) in an inert atmosphere until the wetting of the yttrium to the silicon carbide wafers reaches about 90% completeness, then increasing the temperature by about 50° C. to obtain 100% wetting of the yttrium to the silicon carbide wafers and cause the traveling solvent phenomenon to occur, and thereafter allowing the materials to cool.

References Cited

UNITED STATES PATENTS

| | | | |
|---|---|---|---|
| 2,996,415 | 8/1961 | Hergenrother | 148—1.5 |
| 2,996,456 | 8/1961 | Hergenrother | 252—62.3 |
| 3,205,101 | 9/1965 | Mlavsky et al. | 148—171 |
| 3,301,716 | 1/1967 | Kleinknecht | 148—1.5 |
| 3,396,059 | 8/1968 | Giammanco | 148—171 |
| 3,458,779 | 7/1969 | Blank et al. | 148—171 UX |
| 3,484,302 | 12/1969 | Maeda et al. | 148—1.5 |

OTHER REFERENCES

Halden, F. A. "Growth of Silicon Carbide Crystals From Solution in Molten Metal Alloys" Proc. of Conf. on Silicon Carbide, 1959, pp. 115–123.

L. DEWAYNE RUTLEDGE, Primary Examiner

W. G. SABA, Assistant Examiner

U.S. Cl. X.R.

23—208 R, 301 SP; 117—200; 148—1.5, 1.6, 172; 252—62.3 C